(12) United States Patent
Lakus-Becker

(10) Patent No.: US 8,243,821 B2
(45) Date of Patent: Aug. 14, 2012

(54) FOR SPATIAL WYNER ZIV CODING

(75) Inventor: Axel Lakus-Becker, Artarmon (AU)

(73) Assignee: Canon Kabushiki Kaisha, Tokyo (JP)

( * ) Notice: Subject to any disclaimer, the term of this patent is extended or adjusted under 35 U.S.C. 154(b) by 378 days.

(21) Appl. No.: 12/522,306

(22) PCT Filed: Mar. 28, 2008

(86) PCT No.: PCT/AU2008/000448
§ 371 (c)(1),
(2), (4) Date: Sep. 1, 2009

(87) PCT Pub. No.: WO2008/119117
PCT Pub. Date: Oct. 9, 2008

(65) Prior Publication Data
US 2010/0034290 A1 Feb. 11, 2010

(30) Foreign Application Priority Data
Mar. 30, 2007 (AU) ................................ 2007201403

(51) Int. Cl.
*H04N 7/12* (2006.01)
(52) U.S. Cl. ......... 375/240.25; 375/240.03; 375/240.12; 375/240.18; 375/245; 348/400.1; 348/402.1; 348/407.1
(58) Field of Classification Search ............ 375/240.03, 375/240.05, 240.08, 240.12, 240.16, 240.17, 375/240.18, 245; 348/400, 401, 402, 405, 348/407; 395/200.18, 200.77
See application file for complete search history.

(56) References Cited

U.S. PATENT DOCUMENTS

| | | | |
|---|---|---|---|
| 7,233,269 B1 * | 6/2007 | Chen et al. | 341/107 |
| 7,388,521 B2 * | 6/2008 | Lu et al. | 341/51 |
| 7,414,549 B1 * | 8/2008 | Yang et al. | 341/50 |
| 7,436,332 B2 | 10/2008 | Lakus-Becker | 341/59 |
| 7,697,607 B2 * | 4/2010 | Sugiyama | 375/240.01 |
| 7,965,774 B2 * | 6/2011 | Lu et al. | 375/240.16 |

(Continued)

OTHER PUBLICATIONS

Brites, C., et al., "Feedback Channel in Pixel Domain Wyner-Ziv Video Coding: Myths and Realities", 14$^{th}$ European Signal Processing Conference (EUSIPCO), Florence, Italy, Sep. 4-8, 2006.

(Continued)

*Primary Examiner* — Ayaz Sheikh
*Assistant Examiner* — Andrew C Lee
(74) *Attorney, Agent, or Firm* — Fitzpatrick Cella Harper & Scinto

(57) ABSTRACT

A system (100) for encoding an input video frame (1005), for transmitting or storing the encoded video and for decoding the video is disclosed. The system (100) includes an encoder (1000) and a decoder (1200) interconnected through a storage or transmission medium (1100). The encoder (1000) includes a turbo encoder (1015) for forming parity bit data from the input frame (1005) into a first data source (1120), and a sampler (1020) for down-sampling the input frame (1202) to form a second data source (1110). The decoder (1200) receives data from the second data source (1110) to form an estimate for the frame (1005). The decoder (1200) also receivers the parity bit data from the first data source (1120), and corrects errors in the estimate by applying the parity bit data to the estimate. Each bit plane is corrected in turn. Bits in bit planes other than a bit plane presently being processed are also modified based in a selective manner.

10 Claims, 7 Drawing Sheets

U.S. PATENT DOCUMENTS

| | | |
|---|---|---|
| 7,995,649 B2 * | 8/2011 | Zuo et al. ............... 375/240.03 |
| 2004/0179606 A1 * | 9/2004 | Zhou et al. ............. 375/240.25 |
| 2005/0268200 A1 * | 12/2005 | Garudadri et al. ........... 714/746 |
| 2007/0013561 A1 * | 1/2007 | Xu et al. ........................ 341/50 |
| 2007/0291844 A1 | 12/2007 | Lu ............................ 375/240.16 |
| 2008/0055124 A1 | 3/2008 | Lakus-Becker ................ 341/81 |
| 2008/0079612 A1 | 4/2008 | Lu et al. ........................ 341/50 |
| 2008/0189073 A1 * | 8/2008 | Jagmohan et al. ............ 702/181 |
| 2008/0219346 A1 * | 9/2008 | He et al. ................. 375/240.03 |
| 2009/0031191 A1 * | 1/2009 | Yang et al. ..................... 714/758 |
| 2009/0074077 A1 | 3/2009 | Lakus-Becker .......... 375/240.25 |

OTHER PUBLICATIONS

International Preliminary Report on Patentability, PCT/AU2008/000448, Oct. 6, 2009.

\* cited by examiner

FOR SPATIAL WYNER ZIV CODING

CROSS-REFERENCE TO RELATED PATENT APPLICATIONS

This application claims the right of priority under 35 U.S.C. §119 based on Australian Patent Application No. 2007201403, filed Mar. 30, 2007, which is incorporated by reference herein in its entirety as if fully set forth herein.

FIELD OF THE INVENTION

The present invention relates generally to video encoding and decoding and, in particular, to means of improving Wyner Ziv decoding.

BACKGROUND

Various products, such as digital cameras and digital video cameras, are used to capture images and video. These products contain an image sensing device, such as a charge coupled device (CCD), which is used to capture light energy focussed on the image sensing device. The captured light energy, which is indicative of a scene, is then processed to form a digital image. Various formats are used to represent such digital images, or videos. Formats used to represent video include Motion JPEG, MPEG2, MPEG4 and H.264.

All the formats listed above have in common that they are compression formats. While those formats offer high quality and improve the number of video frames that can be stored on a given media, they typically suffer because of their long encoding runtime.

A complex encoder requires complex hardware. Complex encoding hardware in turn is disadvantageous in terms of design cost, manufacturing cost and physical size of the encoding hardware. Furthermore, long encoding runtime delays the rate at which video frames can be captured while not overflowing a temporary buffer. Additionally, more complex encoding hardware has higher battery consumption. As battery life is essential for a mobile device, it is desirable that battery consumption be minimized in mobile devices.

To minimize the complexity of the encoder, Wyner Ziv coding, or "distributed video coding", may be used. In distributed video coding the complexity of the encoder is shifted to the decoder. In distributed video coding the input video stream is usually split into key frames and non-key frames. The key frames are compressed using a conventional coding scheme, such as Motion JPEG, MPEG2, MPEG4 or H.264, and the decoder conventionally decodes the key frames. With the help of the decoded key frames, the non-key frames are then predicted by the decoder. The processing at the decoder is thus equivalent to carrying out motion estimation which is usually performed at the encoder. The predicted non-key frames are improved in terms of visual quality with the information the encoder is providing for the non-key frames.

The visual quality of the decoded video stream depends heavily on the quality of the prediction of the non-key frames. A prior art approach is to improve the quality of the prediction of the non-key frames by the encoder obtaining more information by carrying out partial motion estimation, or other video analysis methods. This additional information is then additionally transmitted to support the prediction carried out by the decoder. Of course, employing video analysis methods on the encoder increases the complexity of the encoder, which is undesirable.

Another approach employed to improve the quality of the information used by the decoder to predict non-key frames is to do a spatially based motion smoothing. In this situation the Laplace distribution model is employed to represent temporal noise distribution in the smoothed frames. However it has been found that the Laplace distribution model does not properly model the temporal noise distribution. This is because the tails of the Laplace distribution approach zero slower than the actual distribution of the empirical noise.

SUMMARY

It is an object of the present invention to substantially overcome, or at least ameliorate, one or more disadvantages of existing arrangements.

According to an aspect of the present invention, there is provided a method of decoding video data using joint decoding of data from multiple sources that have been independently encoded, said method comprising the steps of:

generating an estimate of said video data from data received from a first source;

correcting at least a portion of a current bit plane in said estimate using parity bits received from a second source; and modifying bits in bit planes other than said current bit plane based upon at least the correction within said current bit plane, thereby reducing the number of bit planes to be corrected.

According to another aspect of the present invention, there is provided an apparatus for implementing any one of the aforementioned method.

According to another aspect of the present invention there is provided a computer program product including a computer readable medium having recorded thereon a computer program for implementing the method described above.

Other aspects of the invention are also disclosed.

BRIEF DESCRIPTION OF THE DRAWINGS

One or more embodiments of the present invention will now be described with reference to the drawings, in which.

DETAILED DESCRIPTION

Figure 1A:
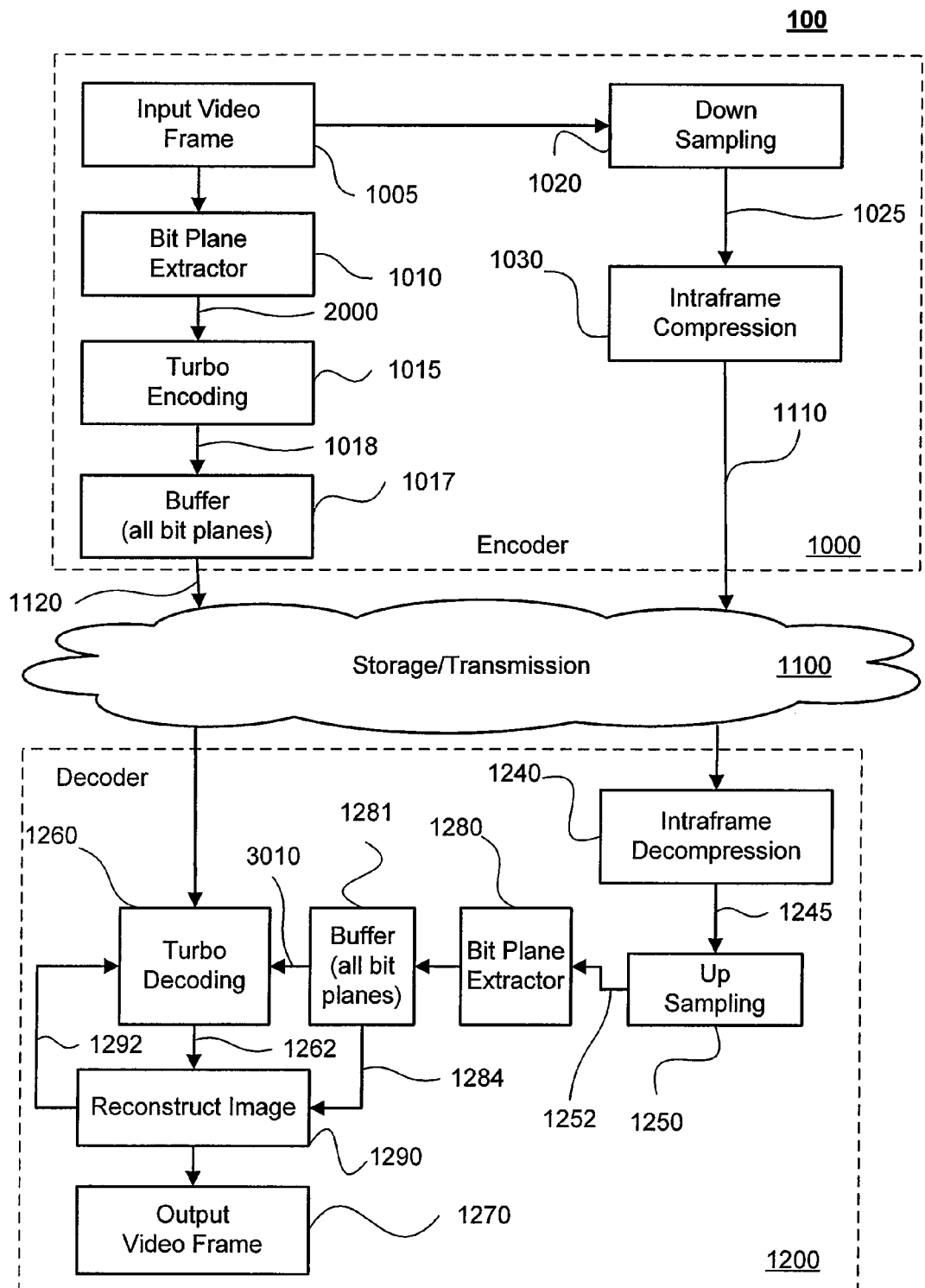
FIG. 1A shows a schematic block diagram of a system for encoding an input video, for transmitting or storing the encoded video, and for decoding the video.

Where reference is made in any one or more of the accompanying drawings to steps and/or features, which have the same reference numerals, those steps and/or features have for the purposes of this description the same function(s) or operation(s), unless the contrary intention appears.

FIG. 1A shows a schematic block diagram of a system 100 for encoding an input video, for transmitting or storing the encoded video and for decoding the video. The system 100 includes an encoder 1000 and a decoder 1200 interconnected through a storage and/or transmission medium 1100. The encoder 1000 forms two independently encoded bit streams 1110 and 1120, which are jointly decoded by the decoder 1200.

Figure 4:
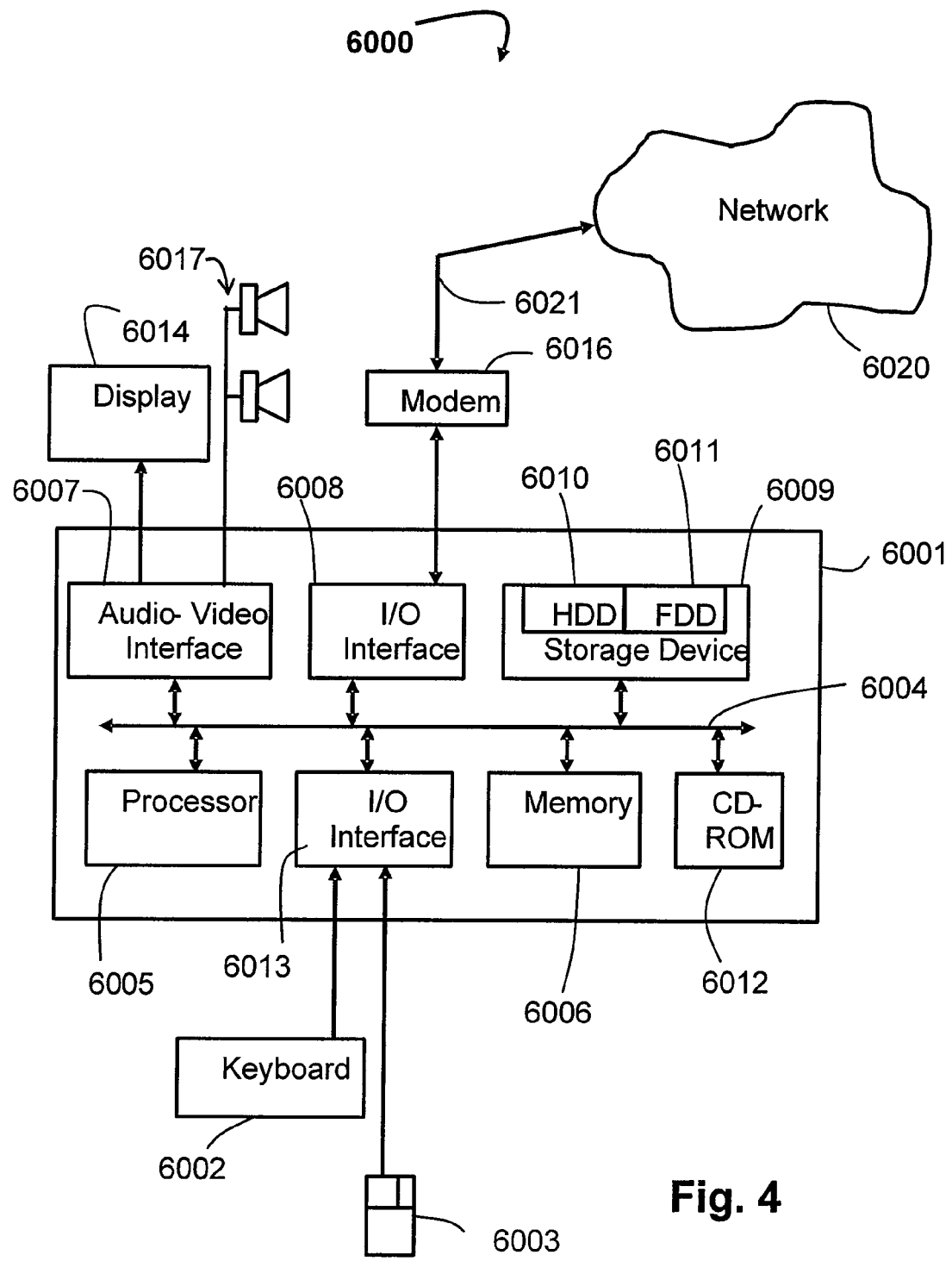
FIG. 4 shows a schematic block diagram of a computer system in which the systems shown in FIGS. 1A and 1B may be implemented.

The components 1000, 1100 and 1200 of the system 100 shown in FIG. 1A may be implemented using a computer system 6000, such as that shown in FIG. 4, wherein the encoder 1000 and decoder 1200 may be implemented as software, such as one or more application programs executable within the computer system 6000. The software may be stored in a computer readable medium, including the storage devices described below, for example. The software is loaded into the computer system 6000 from the computer readable medium, and then executed by the computer system 6000. A computer readable medium having such software or computer program recorded on it is a computer program product.

As seen in FIG. 4, the computer system 6000 is formed by a computer module 6001, input devices such as a keyboard 6002 and a mouse pointer device 6003, and output devices including a display device 6014 and loudspeakers 6017. An external Modulator-Demodulator (Modem) transceiver device 6016 may be used by the computer module 6001 for communicating to and from a communications network 6020 via a connection 6021.

The computer module 6001 typically includes at least one processor unit 6005, and a memory unit 6006. The module 6001 also includes an number of input/output (I/O) interfaces including an audio-video interface 6007 that couples to the video display 6014 and loudspeakers 6017, an I/O interface 6013 for the keyboard 6002 and mouse 6003, and an interface 6008 for the external modem 6016. In some implementations, the modem 6016 may be incorporated within the computer module 6001, for example within the interface 6008. A storage device 6009 is provided and typically includes a hard disk drive 6010 and a floppy disk drive 6011. A CD-ROM drive 6012 is typically provided as a non-volatile source of data.

The components 6005 to 6013 of the computer module 6001 typically communicate via an interconnected bus 6004 and in a manner which results in a conventional mode of operation of the computer system 6000 known to those in the relevant art.

Typically, the application programs discussed above are resident on the hard disk drive 6010 and read and controlled in execution by the processor 6005. Intermediate storage of such programs and any data fetched from the network 6020 may be accomplished using the semiconductor memory 6006, possibly in concert with the hard disk drive 6010. In some instances, the application programs may be supplied to the user encoded on one or more CD-ROM and read via the corresponding drive 6012, or alternatively may be read by the user from the network 6020. Still further, the software can also be loaded into the computer system 6000 from other computer readable storage media. Computer readable storage media refers to any storage medium that participates in providing instructions and/or data to the computer system 6000 for execution and/or processing.

The system 100 shown in FIG. 1A may alternatively be implemented in dedicated hardware such as one or more integrated circuits. Such dedicated hardware may include graphic processors, digital signal processors, or one or more microprocessors and associated memories.

In one implementation, the encoder 1000 and the decoder 1200 are implemented within a camera (not illustrated), wherein the encoder 1000 and the decoder 1200 may be implemented as software executing in a processor of the camera, or implemented using hardware.

In a second implementation only the encoder 1000 is implemented within a camera, wherein the encoder 1000 may be implemented as software executing in a processor of the camera, or implemented using hardware.

Referring again to FIG. 1A, a video frame 1005 is received as input to system 100. Preferably every input video frame 1005 is processed by the system 100. In an alternative embodiment only every fifth input video frame is encoded using the system 100. In yet another alternative embodiment a selection of input video frames 1005 is made from the input video, with the selection of the input video frame 1005 depending on the video content. For example, if an occlusion of an object represented in the input video is observed, and if the extent of the observed occlusion is found to be above a threshold, then the input video frame 1005 is encoded using the system 100.

In the encoder 1000 the input video frame 1005 is down sampled by a sampler 1020 to form a down sampled version 1025 of the input video frame, and that down sampled version 1025 of the input video frame 1005 is then compressed using an intraframe compression module 1030 to form bit stream 1110. This bit stream 1110 is transmitted over, or stored in, the storage or transmission medium 1100, for decompression by the decoder 1200.

In the preferred embodiment a down sampling filter with a cubic kernel is employed by the sampler 1020. The default down sampling rate is two, meaning the resolution is reduced to one half of the original resolution in both the horizontal and vertical dimensions. A different down sampling rate may be defined by a user. Alternative down sampling methods may be employed by the sampler 1020, such as the nearest neighbour, bilinear, bi-cubic, and quadratic down sampling filters using various kernels such as Gaussian, Bessel, Hamming, Mitchell or Blackman kernels.

The compression employed by the intraframe compression module 1030 may be baseline mode JPEG compression, compression according to the JPEG2000 standard, or compression according to the H.264 standard.

Independently from the down sampling in sampler 1020 and the compression in intraframe compression module 1030, parts of the selected input video frame 1005 are used to form a bit stream 1120. In this regard, the input video frame 1005 is also input to a bit plane extractor 1010 where the bit planes are turned into a bit stream. Preferably the extractor 1010 scans the frame 1005 and scanning starts with a first pass on the most significant bit plane of the frame 1005 and concatenates the most significant bits of the frame 1005. This forms a bit stream containing the most significant bits. In a second pass, the scanning concatenates the second most significant bits of the frame 1005. The bits from the second scanning path are appended to the bit stream generated in the previous scanning path. Where the input video frame 1005 is a transformed frame (obtained for example from DCT compression) these operations may be performed on the transform coefficients of the frame 1005.

The scanning and appending continues in this manner until the least significant bit plane is completed. This generates one bit stream for each single input video frame 1005. In the preferred embodiment the scanning follows a raster scanning order wherein each single pixel is processed. In alternative embodiments the scanning path may be similar to the scanning path employed in the JPEG 2000 standard. In yet another alternative embodiment not every pixel is processed. The bit plane extractor 1010 is configured to extract a specified subset of pixels within each bit plane to generate a bit stream 2000 containing bits for spatial resolutions lower than the original resolution.

The output bit stream 2000 from the bit plane extractor 1010 is encoded in a turbo coder 1015 to produce a bit stream 1018 containing parity information. In the embodiment of FIG. 1A, for each single bit plane in the input video frame 1005, parity bits are produced. Accordingly, if the bit depth of the input video frame 1005 is eight, then eight sets of parity bits are produced of which each single parity bit set refers to one bit plane only. The parity bits output by the turbo encoder 1015 are buffered in buffer 1017 before being stored in, or transmitted over, storage or transmission medium 1100 in the bit stream 1120.

Figure 2:
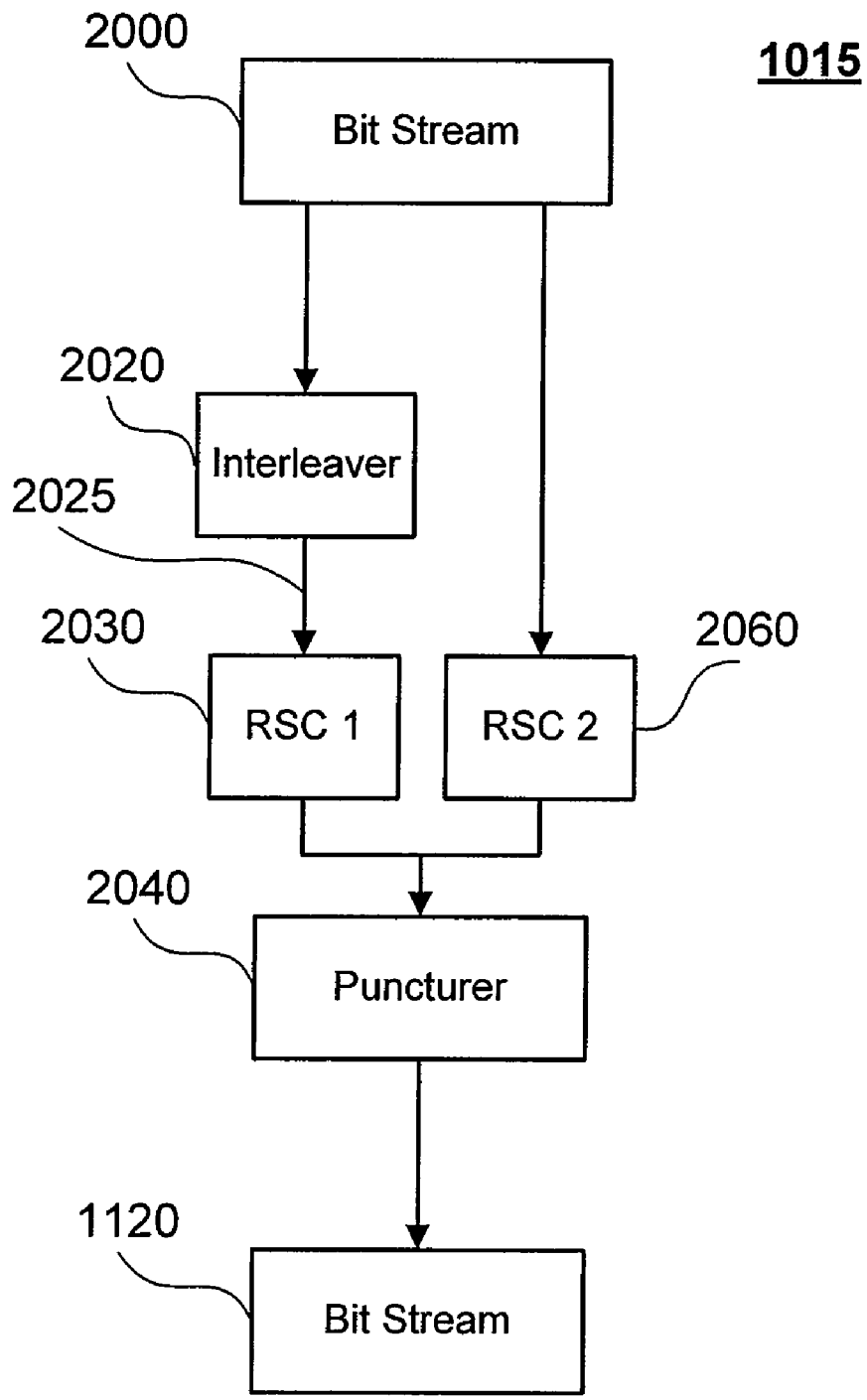
FIG. 2 shows a schematic block diagram of a turbo coder of the systems of FIGS. 1A and 1B.

The operation of the turbo coder 1015 is described in greater detail with reference to FIG. 2.

The encoder 1000 thus forms two bitstreams 1110 and 1120, both derived from the same single input video frame 1005. The two bit streams 1110 and 1120 from the intraframe compression module 1030 and turbo coder 1015 (via buffer 1017) respectively may be multiplexed into a single bit stream, which is then stored in, or transmitted over, storage or transmission medium 1100.

Having described an overview of the operation of the encoder 1000, an overview of the operation of the decoder 1200 is described next. The decoder 1200 receives two inputs. The first input is the bit stream 1120 from the turbo coder 1015 (via buffer 1017), and the second input is the bit stream 1110 from the intraframe compression module 1030.

Bit stream 1110 is processed by an intraframe decompressor 1240 which performs the inverse operation to the intraframe compressor 1030 in a manner known in the art. The intraframe decompressor 1240 restores an approximation 1245 of the down sampled version of the input video frame.

This approximation 1245 of the down sampled version of the input video frame is then up sampled by sampler 1250. Preferably a cubic filter is used during the up sampling. It is noted that the up sampling method used by sampler 1250 does not have to be the inverse of the down sampling method used by the sampler 1020. For example, a bilinear down sampling and a cubic up sampling may be employed. The output from sampler 1250 is an estimate 1252 of the input video frame 1005. That output 1252 from the sampler 1250 is input to a bit plane extractor 1280, which in the preferred embodiment is identical to the bit plane extractor 1010 of the encoder 1000. The output from the bit plane extractor 1280 is stored in a buffer 1281.

The decoder 1200 further includes a turbo decoder 1260, which is described later in detail with reference to FIG. 3. The turbo decoder 1260 operates on each bit plane in turn to correct at least a portion of that (current) bit plane. In a first iteration the turbo decoder 1260 receives the parity bits for the first (most significant) bit plane from bit stream 1120 as input. The turbo decoder 1260 also receives the first bit plane from the bit plane buffer 1281 as side information. The turbo decoder 1260 uses the parity bits for the first bit plane to improve the approximation of the first bit plane of the down sampled version of the input video frame, thereby outputting a decoded first bit plane.

The decoded first bit plane is output 1262 to an image reconstruction module 1290, which is described in detail later with reference to FIG. 6. The image reconstruction module 1290 also receives as input 1284 all bit planes other than the first (most significant) bit plane from the buffer 1281. The image reconstruction module 1290 selectively modifies the bit plane data 1284 received from the buffer 1281 for bit planes lower than a current bit plane, which in the first iteration is the most significant bit plane.

Following selective modification of the bit plane data of bit planes lower that the current bit plane, the image reconstruction module 1290 passes the bit plane data 1292 of the next highest bit plane to the turbo decoder 1260 for decoding using parity bits of the next bit plane from the bit stream 1120. In this manner the turbo decoder 1260 receives bit plane data of each bit plane of the approximation of the down sampled version of the input video frame in turn, with the first bit plane being received from the buffer 1281 and subsequent bit planes being received from the image reconstruction module 1290, and decodes that bit plane data using the parity bits of the corresponding bit plane received from bit stream 1120. Once the last (least significant) bit plane is decoded by the turbo decoder 1260 the image reconstruction module 1290 outputs video frame 1270 as the final approximation of the input video frame 1005.

Figure 1B:
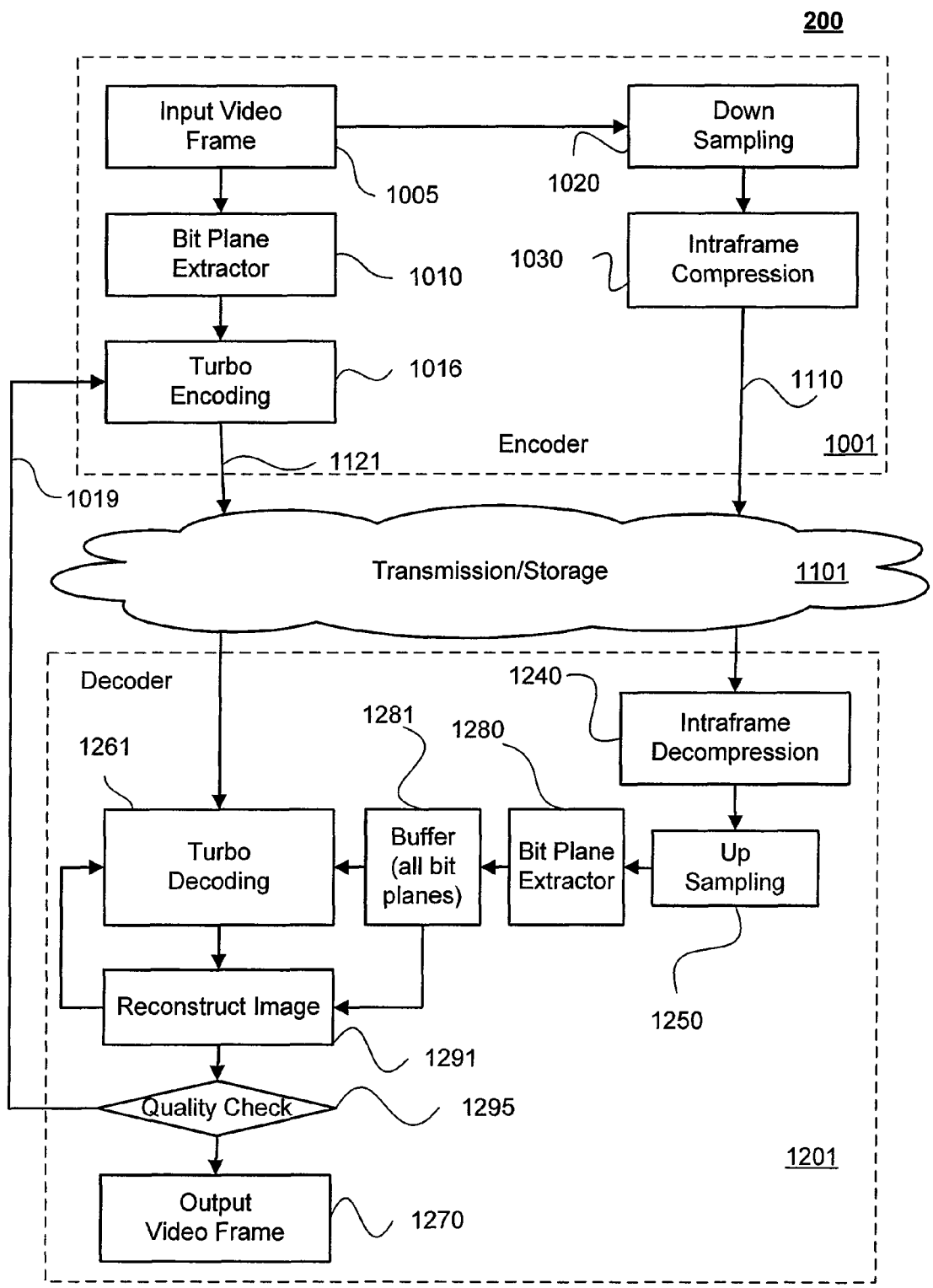
FIG. 1B shows a schematic block diagram of an alternative system for encoding and decoding video.

FIG. 1B shows a schematic block diagram of another system 200 for encoding an input video frame 1005 in an encoder 1001, for transmitting the encoded video frame through transmission medium 1101, and for decoding the encoded video frame in a decode 1201. System 200 includes a number of components having the same functionality as components in the system 100 of FIG. 1A. Accordingly, such components have been given the same reference numerals.

The encoder 1001 forms an encoded bit stream 1110 in a manner similar to that described with reference to encoder 1000 of FIG. 1A. In order for the encoder 1001 to form a second bit stream 1121, the input video frame 1005 is input to a bit plane extractor 1010 where each block of coefficients is turned into a bit stream. The output bit stream from the bit plane extractor 1010 is then encoded in a turbo coder 1016 to produce the (second) bit stream 1121 containing parity information. Each bit plane is encoded separately, starting with the most significant bit plane, in response to an input 1019 from the decoder 1201. Hence, parity bits are not automatically produced for each bit plane in the input video frame 1005, but rather only a selected number of bit planes based upon a request via input 1017 from the decoder 1201.

The two bitstreams 1110 and 1121 formed by the encoder 1001 from the same single input video frame 1005 are transmitted to the decoder 1201 through transmission medium 1101. Bit stream 1110 is processed in the manner described with reference to FIG. 1A to produce a bit stream for all the bit planes stored in the buffer 1281.

A turbo decoder 1261 of the decoder 1201 also operates on each bit plane in turn. The turbo decoder 1261 receives the parity bits (bit stream 1121) for the first (most significant) bit plane from the turbo encoder 1016, as well as the first bit plane from the bit plane buffer 1281. The turbo decoder 1260 uses the parity bits for the first bit plane to improve the approximation of the first bit plane of the down sampled version of the input video frame thereby outputting a decoded first bit plane to an image reconstruction module 1291. The image reconstruction module 1291 also receives as input all bit planes other than the first (most significant) bit plane from the buffer 1281, and selectively modifies the bit plane data received from the buffer 1281 for bit planes lower than the current bit plane in a manner described below in more detail with reference to FIG. 6.

Following selective modification of the bit plane data of bit planes lower that the current bit plane, the image reconstruction module 1291 outputs a video frame to a quality check module 1295. The quality check module 1295 determines whether the video frame received from the image reconstruction module 1291 meets a criterion. In one embodiment the criterion is determined through user visual inspection. In an alternative embodiment the quality is measured in terms of rate distortion performance: an expected quality improvement by correction the next bit plane is predicted. If the expected improvement is found not to be sufficient, no further bit planes are corrected. In yet another embodiment at least parts of the video frame are compared to some predetermined reference in terms of objective quality measures, such as the peak signal-to-noise ratio (PSNR), for example. In yet another embodiment the PSNR is estimated using quantized pixel values.

If the quality of the video frame meets the criterion then further correction of bit planes lower than the current bit plane is terminated and the video frame is output as video frame 1270, which is an approximation of the input video frame 1005.

However, if the quality check module 1295 determines that the quality of the video frame does not meets the criterion then a request is sent to the turbo encoder 1016 through input 1019 for parity bits of a next bit plane.

In response to the input 1019, the turbo encoder 1016 processes a next highest bit plane of the input video frame 1005 to produce parity bits, which are transmitted over bit stream 1121 to the turbo decoder 1261. The turbo decoder 1260 uses the parity bits of the next bit plane to decode the bit plane data for the next bit plane received from the image reconstruction module 1291.

The decoded next bit plane is then passed to the image reconstruction module 1291 which selectively modifies the bit plane data for bit planes lower than the current bit plane. The image reconstruction module 1291 then outputs the video frame to the quality check module 1295 which again determines whether the video frame received from the image reconstruction module 1291 meets the criterion.

Each time the quality of the video frame does not meet the criterion, parity bits for a next bit plane are requested from the turbo encoder 1016 and used by the turbo decoder 1261 to the video frame. This continues until the video frame meets the criterion, in which case the video frame is output as video frame 1270.

Having described systems 100 and 200 for encoding an input video to form two independently encoded bit streams, and jointly decoding the bit streams to provide output video, components of those systems 100 and 200 are now described in more detail, string with turbo encoders 1015 and 1016. FIG. 2 shows a schematic block diagram of the turbo coder 1015. Turbo encoder 1016 operates in a manner similar to turbo encoder 1016 with the exception that bit planes are encoded separately, staring with the most significant bit plane, and only in response to a request from the decoder 1201.

The turbo coder 1015 receives as input bit stream 2000 from the bit plane extractor 1010. An interleaver 2020 interleaves the bit stream 2000 (the information bit stream). In the preferred embodiment this interleaver 2020 is a block interleaver. However, in alternative embodiments any other interleaver known in the art, for example a random or pseudo-random interleaver, or a circular-shift interleaver, may be used.

The output from the interleaver 2020 is an interleaved bit stream 2025, which is passed on to a recursive systematic coder 2030 which produces parity bits. One parity bit per input bit is produced. In the preferred embodiment the recursive systematic coder 2030 is generated using the octal generator polynomials 7 (binary $111_2$) and 5 (binary $101_2$).

A second recursive systematic coder 2060 operates directly on the bit stream 2000 from the bit plane extractor 1010. In the preferred embodiment the recursive systematic coders 2030 and 2060 are identical. Both recursive systematic coders 2030 and 2060 output a parity bit stream to a puncturer 2040, with each parity bit stream being equal in length to the input bit stream 2000.

The puncturer 2040 deterministically deletes parity bits to reduce the parity bit overhead previously generated by the recursive systematic coders 2030 and 2060. Typically, so called half-rate codes are employed, which means that half the parity bits from each recursive systematic encoder 2030 and 2060 are punctured. In an alternative embodiment the puncturer 2040 may depend on additional information, such as the bit plane of the current information bit. In yet another alternative embodiment the scheme employed by the puncturer 2040 may depend on the spatial location of the pixel to which the information bit belongs, as well as the frequency content of the area around this pixel.

The turbo coder 1015 produces as output the punctured parity bit stream 1120, which comprises parity bits produced by recursive systematic coders 2060 and 2030. This concludes the detailed description of the turbo encoder 1015.

The turbo decoder 1260 is now described in detail with reference to FIG. 3 where a schematic block diagram of the turbo decoder 1260 is shown. Turbo decoder 1261 operates in the same manner as turbo decoder 1260. The parity bits 3000 in bit stream 1120 are split into two sets of parity bits: one set for the parity bits 3020 originating from the recursive systematic coder 2030 (FIG. 2) and one set of parity bits 3040 originating from the recursive systematic coder 2060 (FIG. 2).

Parity Bits 3020 are then input to a (first) Component Decoder 3060, which preferably employs the Soft Output Viterbi Decoder (SOVA) algorithm known in the art. Alternatively, a Max-Log Maximum A Posteriori Probability (MAP) algorithm known in the art may be employed. In yet another alternative embodiment, variations of the SOVA or the MAP algorithms are used.

Systematic bits 3010 from buffer 1281 are passed as input to an interleaver 3050. This interleaver 3050 is also linked to the component decoder 3060. In a similar manner, parity bits 3040 are input to a (second) Component Decoder 3070, together with the systematic bits 3010.

Figure 3:
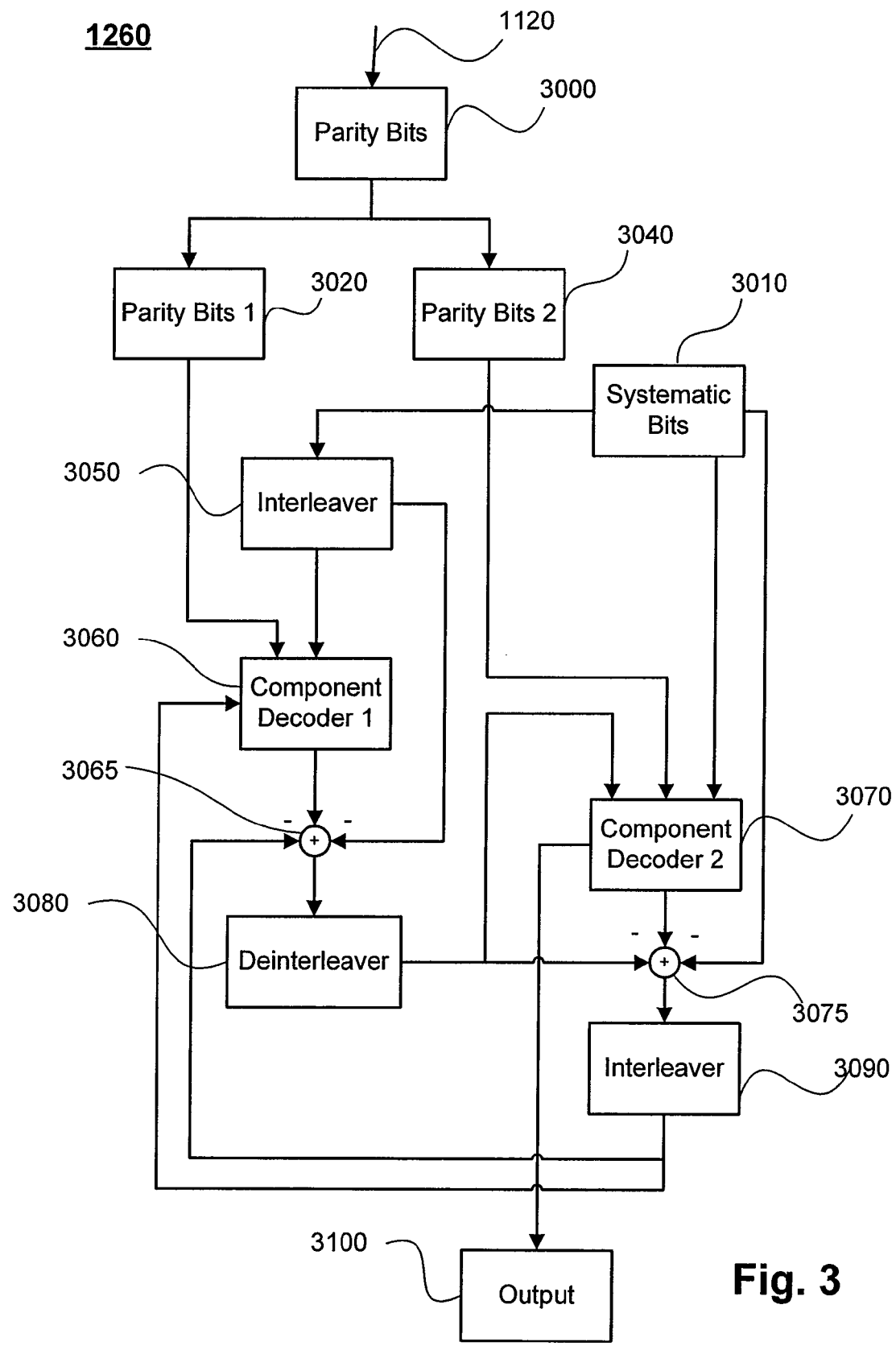
FIG. 3 shows a schematic block diagram of a turbo decoder of the systems of FIGS. 1A and 1B.

As can be seen in FIG. 3, the turbo decoder 1260 works iteratively. A loop is formed starting from the component decoder 3060, to an adder 3065, to a deinterleaver 3080, to the component decoder 3070, to adder 3075, to interleaver 3090 and back to component decoder 3060.

The component decoder 3060 takes three inputs; the parity bits 3020, the interleaved systematic bits from the interleaver 3050 and output from the second component decoder 3070 which has been modified in adder 3075 and interleaved in the interleaver 3090. The input from the one component decoder to the other component decoder provides information about the likely values of the bits to be decoded. This information is typically provided in terms of the Log Likelihood Ratios $$L(u_k) = \ln\left(\frac{P(u_k = +1)}{P(u_k = -1)}\right), \text{ where } P(u_k = +1)$$

denotes the probability that the bit $u_k$ equals $+1$ and where $P(u_k=-1)$ denotes the probability that the bit $u_k$ equals $-1$.

In the first iteration the feedback input from the second component decoder 3070 does not exist. Therefore, in the first iteration the feedback input from the second component decoder 3070 is set to zero.

The (decoded) bit sequence produced by component decoder 3060 is passed on to adder 3065 where the so called a priori information related to the bit stream is produced. The received systematic bits 3050 are extracted in adder 3065 and the information produced by the second component decoder 3070 (which are processed analogously in adder 3075 and interleaved in interleaver 3090) are extracted as well. Left over is the a priori information which gives the likely value of a bit. This information is valuable for the next decoder.

After the adder 3065, the resulting bit stream is de-interleaved in a deinterleaver 3080, which performs the inverse action of the interleaver 3050. The de-interleaved bit stream from the deinterleaver 3080 is provided as input to the second component decoder 3070. In the preferred embodiment the second component decoder 3070 and the associated adder 3075 work analogously to the first component decoder 3060 and the associated adder 3065, already described. The resulting bit stream is again interleaved in the interleaver 3090 and used as input for the second iteration to the first component decoder 3060.

In the preferred embodiment eight iterations between the first component decoder 3060 and the second component decoder 3070 are carried out. An increased number of iterations may be used to improve the final result. After completion of eight iterations the resulting bit stream produced from component decoder 3070 is output 3100.

Figure 5:
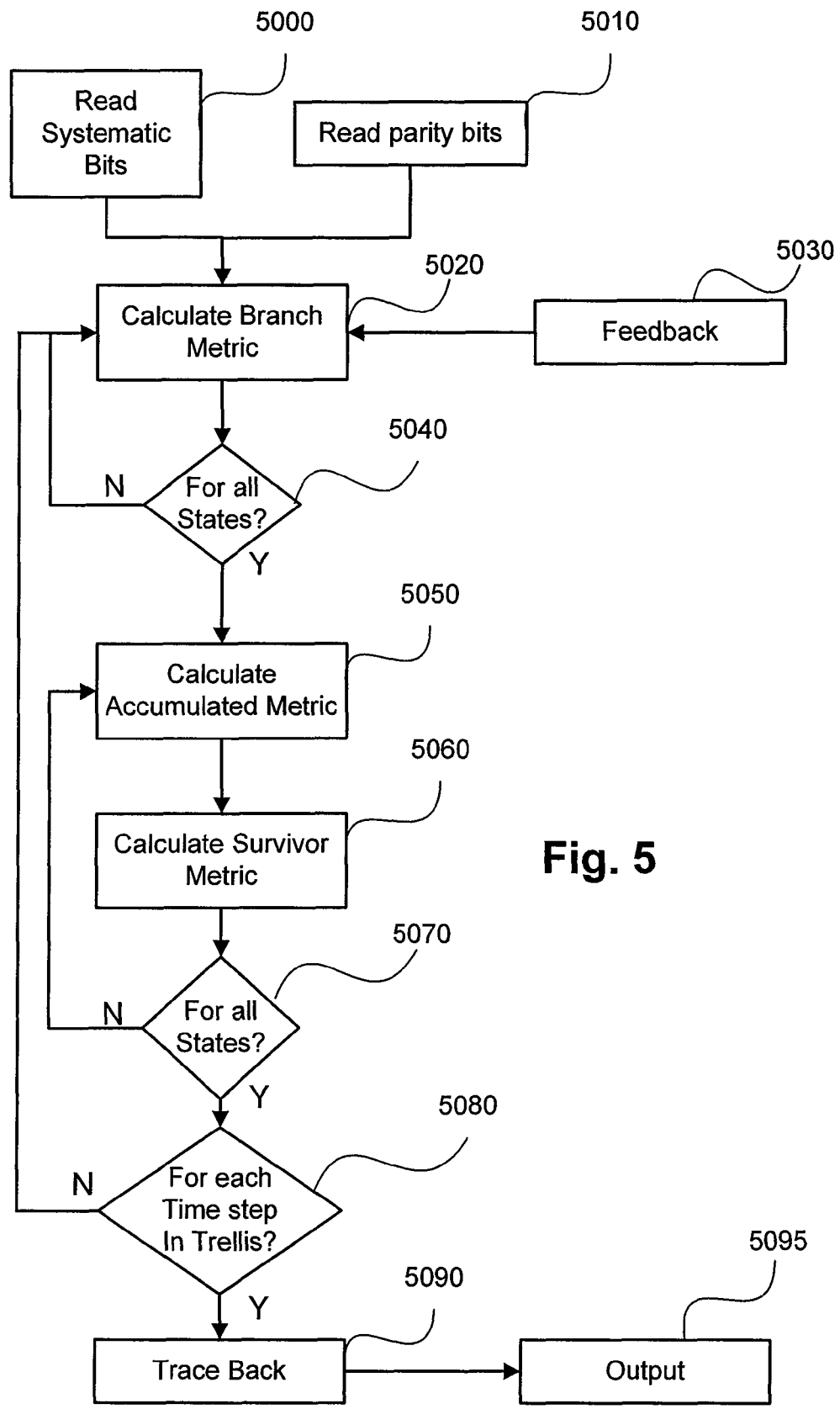
FIG. 5 shows a schematic flow diagram of a process performed in a component decoder of the turbo decoder of FIG. 3.

The component decoder 3060 is now described in more detail with reference to FIG. 5 where a schematic flow diagram of the process performed by the component decoder 3060 is shown. As mentioned above, the two component decoders 3060 and 3070 need not be identical. However, in the preferred embodiment the component decoders 3060 and 3070 are identical. The component decoder 3060 commences operation by reading the systematic bits 3010 (FIG. 3) in step 5000. As noted above, the systematic bits 3010 are the output of the buffer 1281 (FIGS. 1A and 1B). In step 5010 the parity bits 3020 (FIG. 3) are read. Processing continues in step 5020 where the so called branch metric is computed, with the branch metric being well known in the art. The branch metric is a measure for the decoding quality for the current code word. It is zero if the decoding of the current code word is error free. Code word decoding errors can sometimes not be avoided and can still result in an overall optimal result.

The computation of the branch metric is performed by getting feedback 5030 from the other component decoder step 3070 (FIG. 3) in the form of the log likelihood ratios as already described above. The log likelihood ratios, and as such the calculation of the branch metrics, is based on a model of the noise to be expected on the systematic bits 3010 (FIG. 3). In the preferred embodiment the Laplace noise model is employed to compensate for errors in the systematic bits 3010.

The noise to be expected on the systematic bits 3010 originates from a JPEG compression and the down and up-sampling. Modelling this noise is generally difficult as reconstruction noise is generally signal dependent (e.g. Gibbs phenomenon) and spatially correlated (e.g. JPEG blocking). This means that in general the errors are not independently, identically distributed. Channel coding techniques, e.g. turbo codes, assume independent, identically distributed noise.

Even though the magnitude of unquantized DC coefficients of the DCT coefficients are generally Gaussian distributed, it has been recognised that the magnitude of unquantized AC coefficients are best described by a Laplacian distribution, and that quantizing coefficients decreases the standard variation of those Laplacian distributions. This means that noise on DC coefficients may be modelled as Gaussian noise, and the noise on AC coefficients may be modelled as Laplace noise. Channel coding techniques, e.g. turbo codes, make the assumption that the noise is additive Gaussian white noise. It is thus disadvantageous to employ unmodified channel coding techniques.

As is evident from FIGS. 1A and 1B, the systematic bits used in the computation of the branch metric in step 5020 originate from a spatial prediction process through the up sampling performed in sampler 1250.

Referring again to FIG. 5, it is next determined in step 5040 whether all states of a trellis diagram have been processed. If all states have not been processed, then processing returns to step 5020. If it is determined in step 5040 that the branch metrics for all states have been calculated, processing continues to step 5050 where the accumulated metric is computed. The accumulated metric represents the sum of previous code word decoding errors, which is the sum of previous branch metrics.

In step 5060 the so-called "survivor" path metrics are calculated. This survivor path metric represents the lowest overall sum of previous branch metrics, indicating what is the optimal decoding up to date.

Next, in step 5070 it is determined whether all states have been processed. If states remain for processing, then processing within the component decoder 3060 returns to step 5050. Once the computation of the branch metrics, the calculation of the accumulated metric and the calculation of the survivor path metrics is completed processing continue for a next time step in the trellis diagram in step 5080. Once the survivor metric is calculated for all nodes in the trellis diagram, trace back is calculated in step 5090. The trace back operation uses the obtained knowledge of which is the best decoding metric (indicating the decoding quality) to generate the decoded bit stream. The output of step 5090 is the final output 5095 of the component decoder 3060. This completes the detailed description of the turbo decoder 1260.

Figure 6:
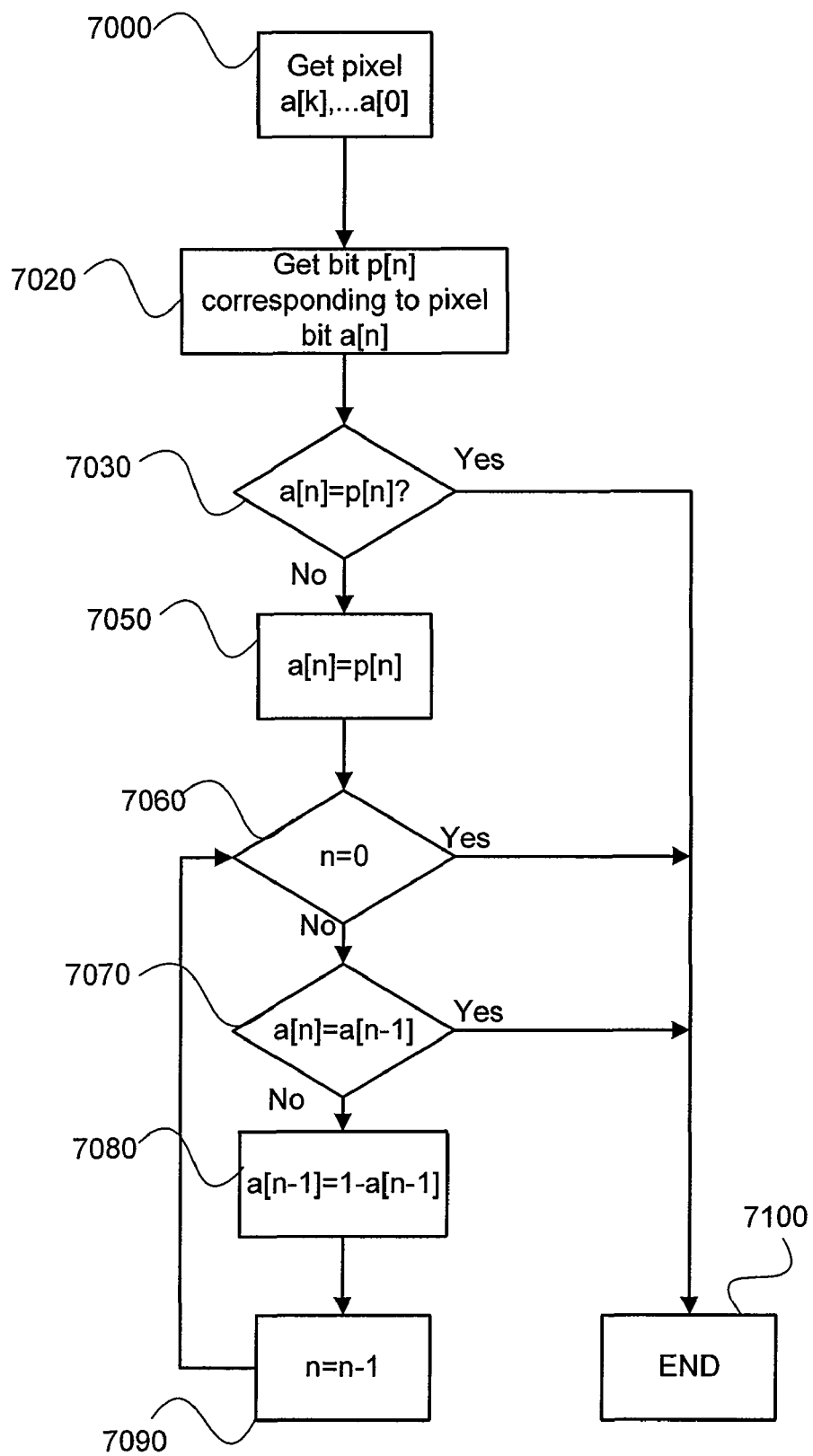
FIG. 6 shows a schematic flow diagram of the operation within an image reconstruction module of the systems of FIGS. 1A and 1B.

Image reconstruction module 1290 is next described in more detail with reference to the schematic flow diagram of FIG. 6 showing the operations performed by the image reconstruction module 1290. Operation in the image reconstruction module 1290 starts in step 7000 where the image reconstruction module 1290 takes all bit plane data from the buffer 1281 of a particular pixel as input. In particular, if the bit depth of the input video frame 1005 is k, all the k bits of that pixel are taken from the buffer 1281. Let a denote the pixel under consideration, and let a[k−1] denote the bit on the most significant bit plane, a[k−2] the bit on the second most significant bit plane and so forth. In step 7000 bit planes a[k−1], a[k−1], . . . , a[0] of all pixels a are retrieved from the buffer 1281.

Next, in step 7020, the image reconstruction module 1290 receives the decoded bit plane of the pixel a being processed from the turbo decoder 1260 as input, with the bit plane of that pixel being improved using the parity bits produced by the turbo encoder 1015. The received bit p[n] from the turbo decoder 1260 corresponds to bit a[n].

In step 7030 the image reconstruction module 1290 determines whether bits a[n] and p[n] are equal. If bits p[n] and a[n] are equal then bit a[n] was not changed by the turbo decoder 1260 and the processing in the image reconstruction module 1290 ends in step 7100 for that pixel. Processing then continues with the next pixel, if such exists.

If it is determined in step 7030 that the bit a[n] was modified by the turbo decoder 1260 then the bit values for the current bit plane n and lower of the pixel a[ ] are selectively modified. In step 7050 the bit value a[n] for the current bit plane n is set to bit p[n]. Next, it is determined in step 7060 whether there are bit planes less significant than the current bit plane n. If there are no less significant bit planes the processing of the current pixel a[ ] ends in step 7100. If the current bit a[n] is not the least significant bit of the pixel a then it is determined in step 7070 whether bits a[n−1] and a[n] are equal. If bits a[n−1] and a[n] are determined not to be equal then bit a[n−1] is set to be its complement in step 7080. In step 7090 counter n is decremented allowing the next less significant bit to be processed from step 7060. Processing continues until bits a[n−1] and a[n] are not equal or bit a[n−1] is in the least significant bit plane.

The image reconstruction module 1290 thus uses the fact that a bit has been corrected by the turbo decoder 1260 as a trigger to selectively modify less significant bit planes for a pixel under consideration. More particularly, those bits in bit planes directly under (less significant) that the bit a[n] corrected by the turbo decoder 1260 having the same value as the corrected bit a[n] are given complement bit values. For example, let the original pixel value in the input video frame 1005 be 128, which is $10000000_2$ in binary representation. Let this value be approximated by the up sampling in the sampler 1250 as 126 ($01111110_2$). The turbo decoder 1260 corrects the pixel's most significant bit from 0 to 1. With the most significant bit corrected, the pixel's value is now 254 ($11111110_2$). The image reconstruction module 1290 modifies bits 6 to 1 to a value of 0, resulting in a value for the pixel of 128 ($10000000_2$), which is a better reconstruction of the original pixel value than the value 254.

This concludes the detailed description of the image reconstruction module 1290.

The foregoing describes only some embodiments of the present invention, and modifications and/or changes can be made thereto without departing from the scope and spirit of the invention, the embodiments being illustrative and not restrictive.

For example, instead of processing the same input video frame 1005 in order to produce the bitstreams 1110 and 1120, in an alternative embodiment bitstream 1110 is formed from a key frame of the input video, whereas bitstream 1120 is formed from non-key frames. In such an embodiment the data in buffer 1281 is then an estimate of the non-key frames, and the turbo decoder 1260 uses the parity data from bitstream 1120 to correct the estimate.

INDUSTRIAL APPLICABILITY

The arrangements described are applicable to the computer and data processing industries and particularly in systems involved with the transmission and/or storage of video data.

The invention claimed is:

1. A method of improving decoded video data quality using joint decoding of data from multiple sources that have been independently encoded, said method comprising the steps of:
generating an estimate of said video data from data received from a first source;
correcting a current bit plane of a pixel in the estimate using parity bits associated with said current bit plane received from a second source;
comparing a value of the current bit plane of the pixel in the estimate of the video data with a value of a lower bit plane of the pixel; and
modifying the value of the lower bit plane of the pixel in the estimate based upon at least the correction within said current bit plane and the comparison, thereby improving the quality of the decoded video data.

2. The method according to claim 1 wherein said estimate is formed from a down-sampled video frame.

3. The method according to claim 1 further comprising, after the correcting and the modifying, the steps of:
reconstructing a video frame from said bit planes;
determining whether said video frame meets a criterion; and
upon said criterion being met, terminating the correcting of bit planes lower than said current bit plane.

4. The method according to claim 1 further comprising, after the correcting and the modifying, the steps of:
reconstructing a video frame from said bit planes;
determining whether said video frame meets a criterion;
upon said criterion not being met, requesting parity bits of a bit plane lower than said current bit plane; and
repeating said correcting and modifying steps with the lower bit plane as said current bit plane.

5. A method according to claim 1, wherein the lower bit plane of the pixel is an adjacent bit plane.

6. A method according to claim 1, further comprising the step of:
decoding the lower bit plane of the pixel using parity bits associated with the lower bit plane received from the second source.

7. A method according to claim 1, further comprising the step of:
selecting a bit plane below the current bit plane as the current bit plane and repeating the correcting, comparing and modifying steps for the current bit plane.

8. A method according to claim 1, further comprising the steps of:
selecting a bit plane below the lower bit plane as a next bit plane;
modifying the next bit plane when the value of the lower bit plane differs from a value of the next bit plane; and
setting the next bit plane as the lower bit plane and repeating the selecting step and the modifying step for the lower bit plane.

9. Apparatus for decoding video data using joint decoding of data from multiple sources that have been independently encoded, said apparatus comprising:
means for generating an estimate of said video data from data received from a first source;
means for correcting a current bit plane of a pixel in the estimate using parity bits received from a second source;
means for comparing a value of the current bit plane of the pixel in the estimate of the video data with a value of a lower bit plane of the pixel; and
means for modifying the value of the lower bit plane of the pixel in the estimate based upon at least the correcting within said current bit plane and the comparing, thereby reducing the number of bit planes to be corrected.

10. A non-transitory computer readable storage medium having recorded thereon a computer program for decoding video data using joint decoding of data from multiple sources that have been independently encoded, said program comprising:
code for generating an estimate of said video data from data received from a first source;
code for correcting a current bit plane of a pixel in the estimate using parity bits received from a second source;
code for comparing a value of the current bit plane of the pixel in the estimate of the video data with a value of a lower bit plane of the pixel; and
code for modifying the value of the lower bit plane of the pixel in the estimate based upon at least the correction within said current bit plane, thereby reducing the number of bit planes to be corrected.

* * * * *